United States Patent
Yahata et al.

(10) Patent No.: US 7,561,429 B2
(45) Date of Patent: Jul. 14, 2009

(54) POWER CONVERTER UNIT

(75) Inventors: Koichi Yahata, Hitachinaka (JP); Seigo Yukutake, Hitachinaka (JP); Yoshio Akaishi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/938,851

(22) Filed: Nov. 13, 2007

(65) Prior Publication Data
US 2008/0112201 A1 May 15, 2008

(30) Foreign Application Priority Data
Nov. 13, 2006 (JP) ............................. 2006-306115

(51) Int. Cl.
*H05K 7/20* (2006.01)
(52) U.S. Cl. ................... 361/715; 361/699; 361/704; 361/719; 165/80.2; 165/104.33; 257/712; 257/714
(58) Field of Classification Search ............... None
See application file for complete search history.

(56) References Cited

U.S. PATENT DOCUMENTS

| | | | |
|---|---|---|---|
| 5,966,291 A * | 10/1999 | Baumel et al. | 361/707 |
| 6,091,604 A * | 7/2000 | Plougsgaard et al. | 361/707 |
| 6,724,627 B2 * | 4/2004 | Onizuka et al. | 361/704 |
| 6,762,937 B2 * | 7/2004 | Kimoto et al. | 361/699 |
| 6,875,029 B2 * | 4/2005 | Kawabata et al. | 439/76.2 |
| 6,972,959 B2 * | 12/2005 | Asai et al. | 361/719 |
| 7,073,410 B2 * | 7/2006 | Albert | 74/606 R |
| 7,375,966 B2 * | 5/2008 | Murakami et al. | 361/707 |
| 7,417,861 B2 * | 8/2008 | Kikuchi et al. | 361/718 |

FOREIGN PATENT DOCUMENTS

JP    2004-282804 A    10/2004

* cited by examiner

*Primary Examiner*—Boris L Chervinsky
(74) *Attorney, Agent, or Firm*—Crowell & Moring LLP (57) ABSTRACT

A power converter unit comprises: a metal casing; a power module mounted in the metal casing and equipped with two or more power semiconductor devices; a metal plate disposed on the power module and fixed to the metal casing; a heat dissipating sheet disposed on the metal plate; and a drive circuit board disposed on the heat dissipating sheet and is equipped with a control circuit for controlling the power semiconductor devices.

20 Claims, 7 Drawing Sheets

POWER CONVERTER UNIT

CLAIM OF PRIORITY

The present application claims priority from Japanese Application Serial No. 2006-306115, filed on Nov. 13, 2006, the content of which is hereby incorporated by reference into this application.

FIELD OF THE INVENTION

The present invention relates to a power converter unit. In particular, it relates to a power converter unit with an improved heat dissipation property of a drive circuit board for controlling power semiconductor devices.

BACKGROUND OF THE INVENTION

Generally, in a power converter unit, in order to reduce the influence of malfunction caused by the noise accompanied on wirings, a drive circuit for driving power semiconductor devices is mounted near the power semiconductor devices. Since the power semiconductor device generate a lot of heat by switching operation, the drive circuit tends to be affected by the heat generated by the power semiconductor devices. Further, in recent years, there is a tendency for the environmental temperature of power converter units to be higher. Therefore, countermeasures, such as raising maximum allowable temperatures of parts mounted on the drive circuit, are required.

If trying to raise the maximum allowable temperatures of drive circuit parts, a cost of the parts to be used will be higher, and reliability will be lowered. A structure for solving the above problem is disclosed in Japanese Patent Laid-open No. 2004-282804 (Patent document 1). In the disclosure, a drive circuit is arranged right above the power semiconductor devices. A drive circuit board on which the drive circuit is mounted is connected to a first heat dissipating plate by using an adhesive. The heat dissipating plate is contacted with a second heat dissipating plate to be fixed to a cooler of the power semiconductor device. Thus, the heat of the drive circuit is reduced by directing the heat of the drive circuit to the cooler through the highly heat dissipating plates.

Patent document 1: Japanese Patent Laid-open No. 2004-282804

However, in the above structure, in order to connect the drive circuit board with the heat dissipating plate, it is necessary to use an adhesive. Therefore, there are required time consuming processes such as a curing time for the adhesive. Also, the drive circuit board is fixed to the heat dissipating plate side. Therefore, it is necessary to carry out wiring between the drive circuit board and the power semiconductor device by using an additional member, such as a flexible substrate etc., making the assembly difficult. Further, the drive circuit board is mounted right above the power semiconductor devices. Therefore, the drive circuit board on the drive circuit is easily be influenced by the switching noise of the power semiconductor device, causing a problem in noise immunity.

SUMMARY OF THE INVENTION

In view of the foregoing, an object of the present invention is to provide a highly reliable power converter unit. One of the more specific objects is to provide a power converter unit whose heat-resistant performance and noise immunity are raised by adopting a simple structure in which the number of assembling processes can be reduced and by adopting a high-shielding and high heat dissipating structure in the drive circuit board.

One of the typical power converter units of the present invention comprises: a metal casing; a power module mounted in the metal casing and equipped with a plurality of power semiconductor devices; a metal plate mounted in the power module and fixed to the metal casing; a heat dissipating sheet provided on the metal plate; and a drive circuit board provided on the heat dissipating sheet and is equipped with a control circuit for controlling the power semiconductor devices.

Preferably, an insulating sheet is provided between the metal plate and the heat dissipating sheet. Also, the heat dissipating sheet is divided into two or more sheets and provided on the insulating sheet. Further, on the drive circuit board, on its surface contacting the heat dissipating sheet, electronic parts are mounted. The electronic parts are disposed between the divided heat dissipating sheets.

Further, it is preferred that the power converter unit has a voltage smoothing capacitor. The voltage smoothing capacitor is electrically connected with the power module using a bus-bar. The metal plate is bent, and part of it is located between the bus-bar and the drive circuit board.

According to the present invention, a highly reliable power converter unit can be provided.

DETAILED DESCRIPTION OF THE PREFERRED EMBODIMENTS

Now, referring to the drawings, embodiments of the present invention will be explained in detail below.

Figure 1:
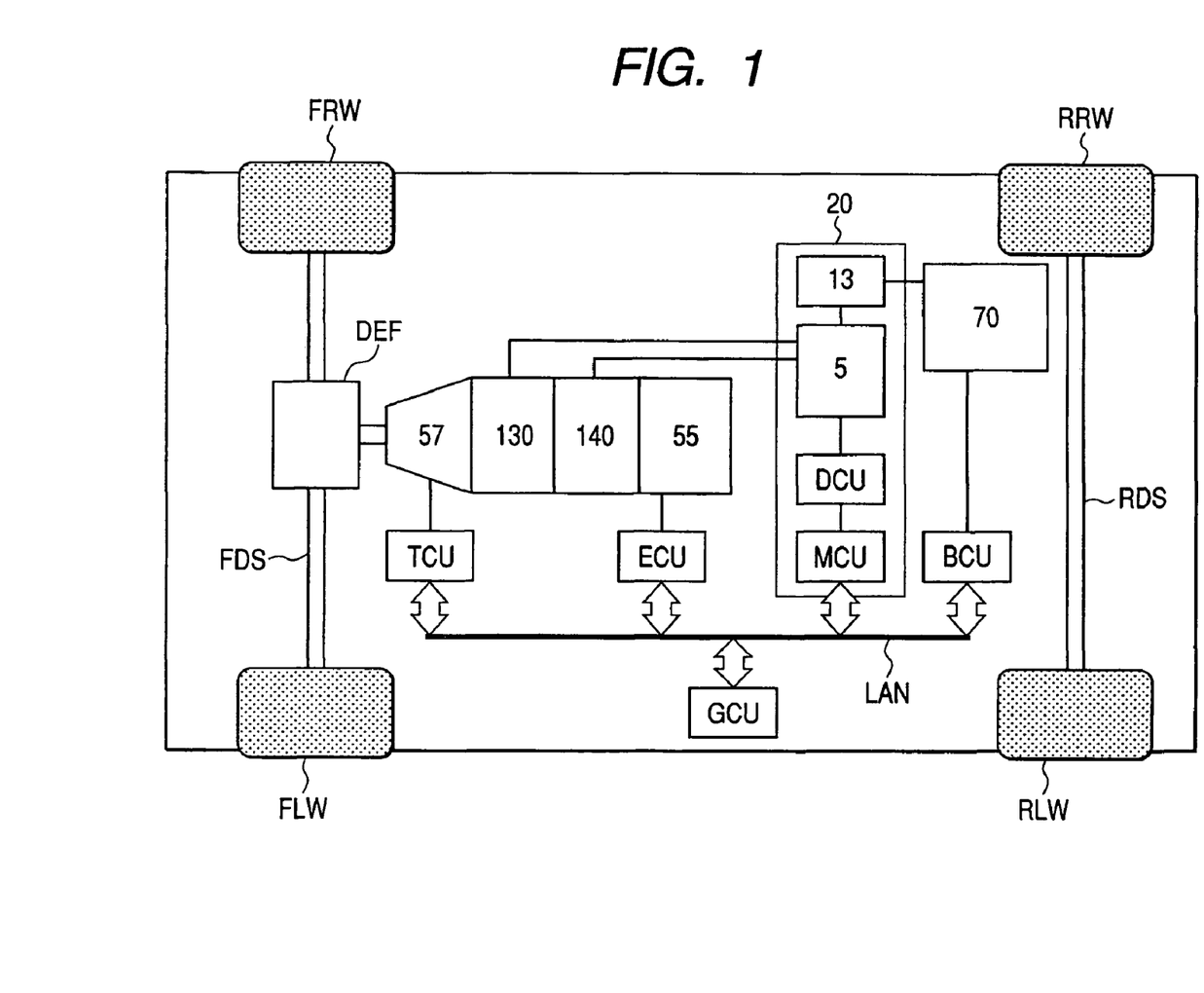
FIG. 1 shows a diagrammatic structure of a vehicle according to an embodiment of the present invention.

FIG. 1 is a block diagram of a hybrid electric vehicle (hereafter, called an "HEV") combining an in-vehicle electrical machinery system comprising a power converter unit 20 of an embodiment of the invention with an engine system of an internal-combustion engine.

The HEV of the present embodiment comprises: front wheels FRW, FLW; rear wheels RRW, RLW; a front-wheel drive shaft FDS; a rear-wheel drive shaft RDS; a differential gear DEF; a transmission 57; an engine 55; a rotating electrical machines 130, 140; a power converter unit 20; a battery 70; an engine control unit ECU; a transmission control unit TCU; a rotating electrical machine control unit MCU; a battery control unit BCU; and an in-vehicle local area network LAN.

In the present example, a driving force is produced by the engine 55 and two rotating electrical machines 130, 140, and is transmitted to the front wheels FRW, FLW through the transmission 57, the differential gear DEF, and the front-wheel drive shaft FDS.

The transmission 57 is a unit which comprises two or more gears, and is capable of changing a gear ratio according to the operation state, such as velocity.

The differential gear DEF is a unit which distributes motive power to right and left appropriately when the right and left wheels FRW, FLW have a speed difference at a curve etc.

The engine 55 comprises a plurality of parts such as an injector, a throttle valve, an igniter, and an air intake/exhaust valve (each of them not shown). The injector is a fuel injection valve which controls the fuel injected into a cylinder of the engine 55. The throttle valve is a valve which controls the quantity of air supplied into the cylinder of the engine 55. The igniter is a fire source which burns an air-fuel mixture in the cylinder of the engine 55. The intake/exhaust valve is an on-off valve provided in air intake and exhaust portions of the cylinder of the engine 55.

The rotating electrical machines 130, 140 are of a three-phase AC synchronous system, namely, permanent-magnet rotating electrical machines. However, a three-phase AC induction type rotating electrical machine, a reluctance type rotating electrical machine, etc. may be used.

The rotating electrical machines 130, 140 comprise rotors which rotate and stators which generate rotational magnetic fields.

The rotor is constructed by embedding two or more permanent magnets in an iron core. Alternatively, the rotor is constructed by arranging two or more permanent magnets on a circumferential surface of the iron core. The stator is constructed by winding a copper wire around an electromagnetic steel plate.

The rotational magnetic field is generated by allowing a three-phase alternating current to flow through the winding wire of the stator. Further, the rotating electrical machines 130, 140 can be rotated by the torque which the rotor produces.

The power converter unit 20 controls the electric current given to the rotating electrical machines 130, 140 by switching operation of a power semiconductor device. That is, the power semiconductor device sends a direct current from the battery 70 to the rotating electrical machines 130, 140 (ON), or cuts the direct current (OFF) to control the rotating electrical machines 130, 140. In the present example, the rotating electrical machines 130, 140 are three-phase AC motors. Therefore, the driving force for the rotating electrical machines 130, 140 is controlled (PWM control) by generating a three-phase AC voltage by unevenness of the time width of an ON-and-OFF switching.

The power converter unit 20 comprises: a capacitor module 13 which supplies an electrical power instantly at the time of switching; a power module 5 which performs the switching; a drive circuit unit DCU which drives the power module 5; and a rotating electrical machine control unit MCU which determines the unevenness of the time width of the switching.

To drive the rotating electrical machines 130, 140 based on a rotational-frequency command n* and a torque command value t* from a general control unit GCU, the rotating electrical machine control unit MCU controls the switching operation of the power module 5. Therefore, the rotating electrical machine control unit MCU carries memories for a microcomputer to perform a required computation, a data map, etc.

The drive circuit unit DCU drives the power module 5 based on the PWM signal determined by the rotating electrical machine control unit MCU. Accordingly, the drive circuit unit DCU carries a circuit with a drive capability of several amperes and tens of volts required for driving the power module 5. Further, to drive the power semiconductor device on the side of high electric potential, the drive circuit unit DCU carries a circuit for isolating control signals.

The battery 70 is a DC power supply and is comprised of a secondary battery of high power density, such as a nickel-hydride battery and a lithium-ion battery. The battery 70 supplies an electric power to the rotating electrical machines 130, 140 through the power converter unit 20. Alternatively, the battery 70 changes and stores the electric power generated by the rotating electrical machines 130, 140 at the power converter unit 20.

The transmission 57, engine 55, power converter unit 20, and battery 70 are controlled, respectively, by the transmission control unit TCU, engine control unit ECU, rotating electrical machine control unit MCU, and battery control unit BCU. These control units are connected to the general control unit GCU through the in-vehicle local area network LAN and are supervised based on a command value from the general control unit GCU. Further, the two-way communications between the above control units and the general control unit GCU are also possible. Each control unit controls devices based on a command signal (command value) of the general control unit GCU, output signals (various parameter values) of various sensors and other control units, data and a map stored in the memory in advance, etc.

For instance, the general control unit GCU computes a required torque value for a vehicle according to the amount of depressing a gas pedal based on an acceleration request from a driver. Further, the general control unit divides and allocates the required torque value as an output torque value on the side of the engine 55, and an output torque value on the side of the first rotating electrical machine 130 so that operation efficiency of the engine 55 may be improved. The allocated output torque value on the side of the engine 55 is transmitted to the engine control unit ECU as an engine torque command signal. The allocated output torque value on the side of the first rotating electrical machine 130 is transmitted to the rotating electrical machine control unit MCU as a motor torque command signal. The torque values control the engine 55 and the rotating electrical machine 130 respectively.

Now, the operating mode of the hybrid vehicle will be explained.

First, when starting the vehicle or the vehicle is traveling at a low speed, the rotating electrical machine 130 is mainly operated as a rotating electrical machine, and the rotational power generated by the rotating electrical machine 130 is transmitted to the front-wheel drive shaft FDS through the transmission 57 and differential gear DEF. As a result, the front-wheel drive shaft FDS rotates according to the rotational power of the rotating electrical machine 130, the front wheels FRW, FLW rotate, and the vehicle starts running. In this regard, the power output (DC power) from the battery 70 is converted to a three-phase AC power by the power converter unit 20 and is supplied to the rotating electric machine 130.

When the vehicle is traveling normally (at a medium or high speed), both the engine 55 and the rotating electrical machine 130 are used. Then, the rotational power generated by the engine 55 and the rotational power generated by the rotating electrical machine 130 are transmitted to the front-wheel drive shaft FDS through the transmission 57 and differential gear DFF. As a result, at the front-wheel drive shaft FDS, the front wheels FRW, FLW rotate according to the rotational power by the engine 55 and the rotating electrical machine 130, and the vehicle keeps traveling. Moreover, part of the rotational power generated by the engine 55 is supplied to the rotating electrical machine 140. By allocating the power, the rotating electrical machine 140 is rotated according to the part of rotational power generated by the engine 55, operates as a power generator, and generates electricity. The three-phase AC electric power generated by the rotating electrical machine 140 is supplied to the power converter unit 20. Then, after once being rectified into the DC power, it is converted to a three-phase AC electric power and is supplied to the rotating electrical machine 130. Accordingly, it becomes possible for the rotating electrical machine 130 to generate the rotational power.

When accelerating the speed of the vehicle, particularly, at the time of sudden acceleration when a throttle valve, which controls the air quantity supplied to the engine 55, is fully opened (for instance, at the time of depressing the accelerator greatly when climbing a steep slope), in addition to the above operation during the normal traveling, the output power from the battery 70 is converted to a three-phase DC power by the power converter unit 20 and is supplied to the rotating electric machine 130. Then, a rotary driving force generated by the rotating electric machine 130 is increased.

When decelerating and braking the vehicle, the rotary driving force of the drive shaft FDS produced by the rotation of the front wheels FRW, FLW is supplied to the rotating electrical machine 130 through the differential gear DFF and the transmission 57, and the rotating electrical machine 130 is operated as a power generator to generate electricity. By the power converter unit 20, the three-phase AC power (regeneration energy) obtained by the generation of electricity is rectified to the DC power by the power converter unit 20 and is supplied to the battery 70. Thus, the battery 70 can be charged.

When the vehicle is stopped, the drive of the engine 55 and the rotating electrical machines 130, 140 is normally suspended. However, when the battery 70 is weak, the engine 55 is driven, the rotating electrical machine 140 is operated as a power generator, and the battery 70 is charged through the power converter unit 20 by using the generated electric power.

The roles of the rotating electric machines 130, 140 for generating electricity and driving are not particularly limited, and the roles of them may be reversed depending on the efficiency.

Figure 2:
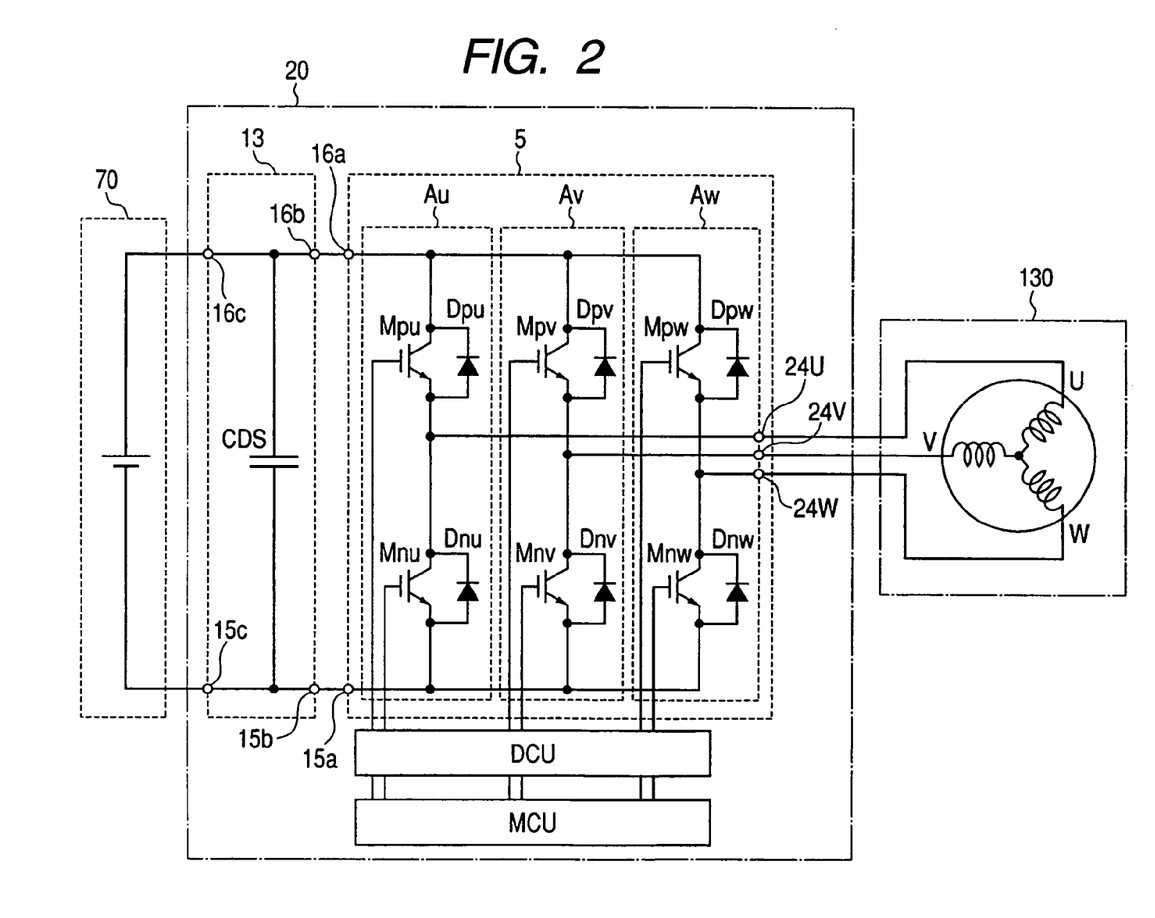
FIG. 2 is a circuit diagram of a power converter unit according to an embodiment of the present invention.

FIG. 2 shows a circuit diagram of a main circuit of the power converter unit 20 of an embodiment of the present invention. Also, like reference numerals refer to like parts in FIG. 1.

The power converter unit 20 of the present embodiment comprises: a capacitor module 13 which supplies electric power instantly at the time of switching; a power module 5 which performs the switching; a drive circuit unit DCU which supplies switching electric power for the power module 5; and a rotating electrical machine control unit MCU which controls the switching operation of the power module 5 for controlling the rotating electrical machines.

In FIG. 2, the structure of the power converter unit 20 corresponding to the first rotating electrical machine 130 only is shown. However, the power converter unit 20 of FIG. 1 also comprises the power module 5 and the drive circuit unit DCU corresponding to the second rotating electrical machine 140, and the structures thereof are the same as those shown in FIG. 2.

The power module 5 constitutes three bridge circuits (Au, Av, Aw) for a three-phase AC output by using power semiconductor devices M (Mpu, Mnu, Mpv, Mnv, Mpw, Mnw) which perform ON/OFF switching operation.

Both ends of the bridge circuit are connected to the connection terminals 15b and 16b of the capacitor module 13 through a connection terminal 15a and a connection terminal 16a. Further, the capacitor module 13 is connected to the battery 70 through the connection terminals 15c and 16c.

A middle point of the bridge circuit is connected to the three-phase input connection terminals (U connection terminal, V connection terminal, W connection terminal) of the rotating electrical machine 130 through the connection terminals 24U, 24V, and 24W.

The bridge circuit is also called an arm. The power semiconductor device connected to the high potential side is called an upper arm and the power semiconductor device connected to the low potential side is called a lower arm.

The power semiconductor devices of the three bridge circuits (Au, Av, Aw) perform the ON/OFF switching operation with a phase difference of 120°, respectively, so as to generate a three-phase AC voltage, and the connections of the high potential side (upper arm) and the low potential side (lower arm) are switched. Accordingly, the three-phase AC voltages having pulse voltage waveforms whose time widths are uneven are generated.

The power semiconductor device M (Mpu, Mnu, Mpv, Mnv, Mpw, Mnw) performs switching by using a large current. As a result, a drive circuit is necessary for driving the power semiconductor device. Therefore the drive circuit unit DCU for driving the power semiconductor device is connected to the power module 5.

Also, the rotating electrical machine control unit MCU is connected to the drive circuit unit DCU. The drive circuit unit DCU receives, from the rotating electrical machine control unit MCU, signals of the number of revolutions of the rotating electrical machine, the time width of switching according to the torque, and timing (unevenness in the width of a pulse voltage), respectively.

In the present example, as the power semiconductor devices M (Mpu, Mnu, Mpv, Mnv, Mpw, Mnw), IGBTs (Insulated Gate Bipolar Transistor) are used. Therefore, external diodes D (Dpu, Dnu, Dpv, Dnv, Dpw, Dnw) for returning the current when switching are connected back to back to the IGBT.

Also, in the present example, the power semiconductor devices M of the upper/lower arm of each phase are formed as one element (two, including the diode). However, depending on the current-carrying capacity, the power semiconductor devices M can be connected in parallel.

In the present example, the IGBT was used as the power semiconductor device M. However, the IGBT may be replaced with a MOSFET (metal-oxide semiconductor field-effect transistor). In such a case, since the diode for returning a current is built in the MOSFET as part of the structure, it is not necessary to attach the diode externally.

Figure 3:
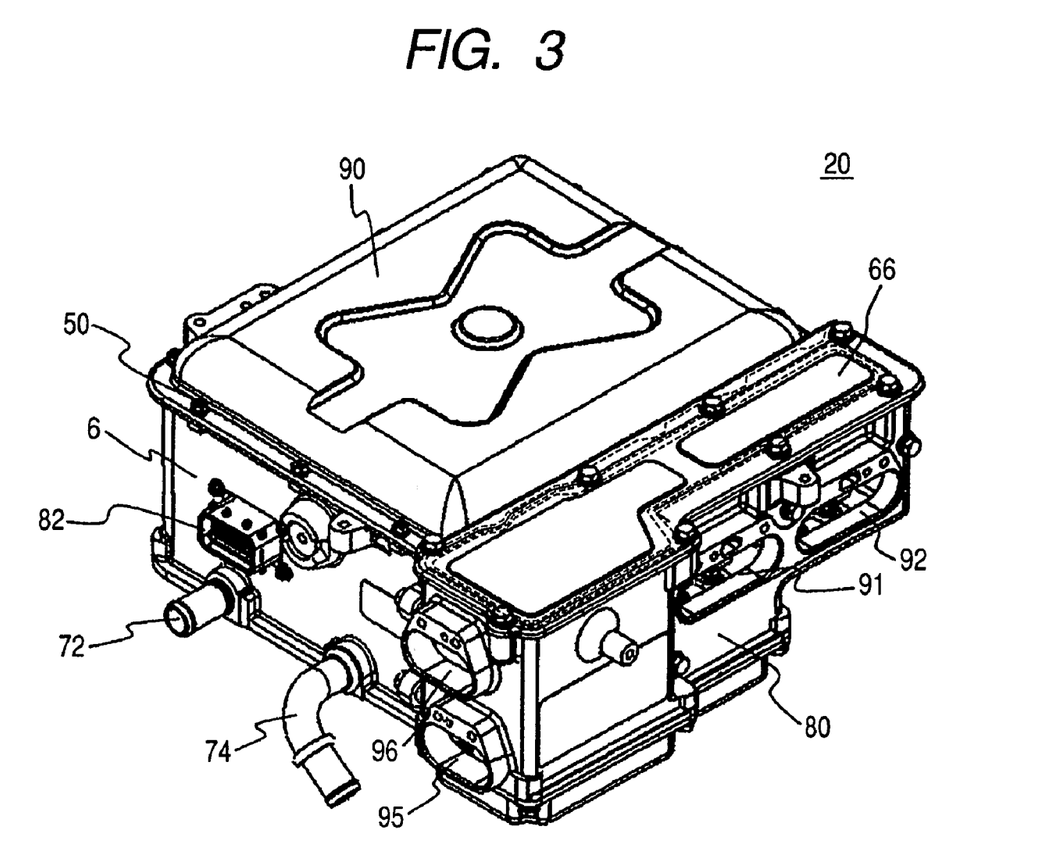
FIG. 3 is an external perspective view of the power converter unit according to an embodiment of the present invention.
Figure 4:
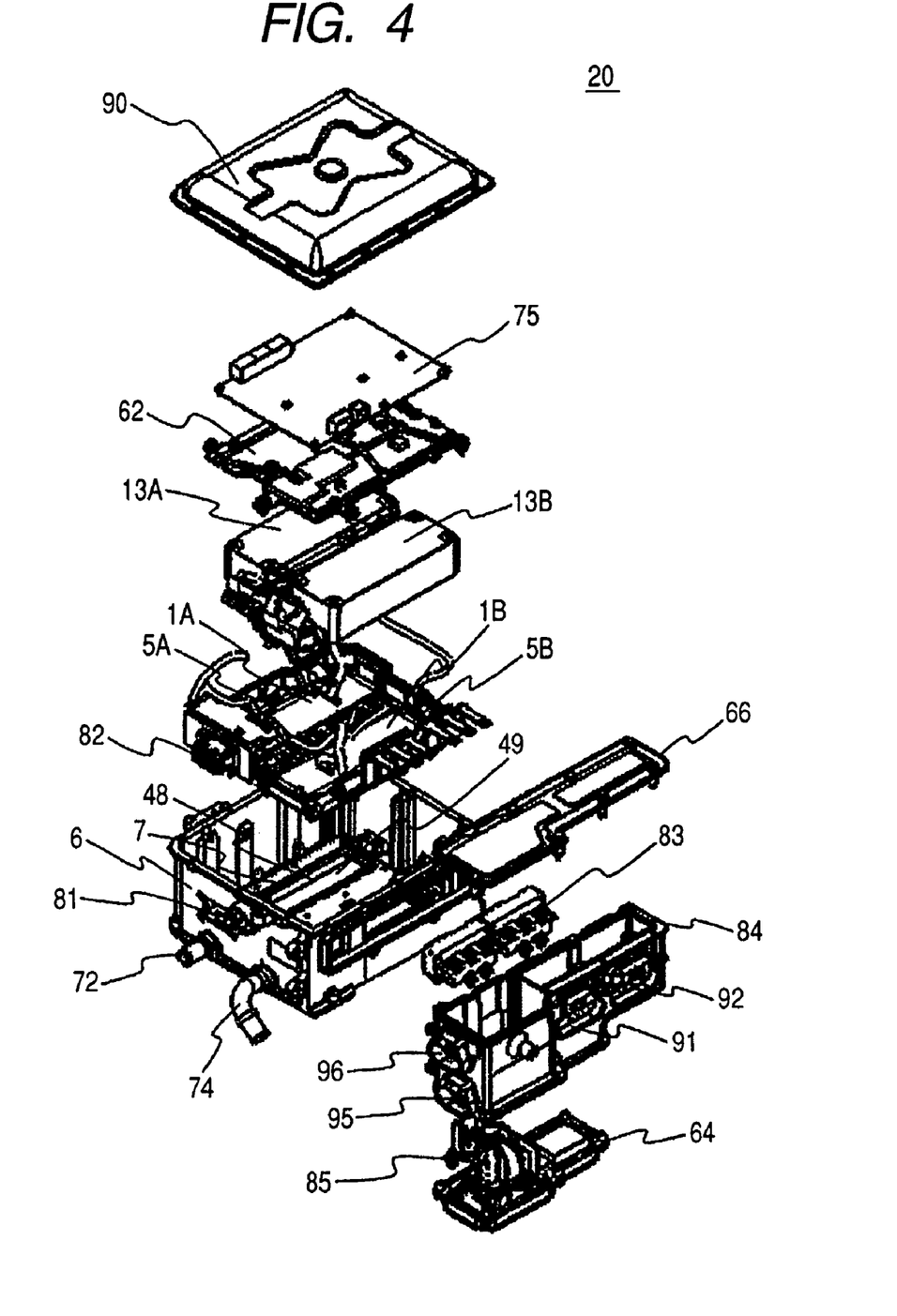
FIG. 4 is an exploded perspective view of the power converter unit according to an embodiment of the present invention.

FIG. 3 is an exploded perspective view of the power converter unit 20 of the present example, and FIG. 4 is an external perspective view of the power converter unit 20 of the present example.

The power converter unit 20 has a metal casing 6 which is in the shape of a box, and parts to make coolant path 48 having a coolant path 7 inside through which cooling water circulates is formed at the bottom of the metal casing 6. At the bottom of the metal casing 6, an inlet tube 72 and an outlet tube 74 for supplying the cooling water to the coolant path 7 project to the outside of the metal casing 6. The parts to make coolant path 48 forms the coolant path, and engine cooling water is used as the refrigerant in the present example.

The power module 5 of the power converter unit 20 comprises a first power module 5A and a second power module 5B which are provided in parallel in the metal casing 6. Heat radiating fins for cooling (not shown) are provided in the first power module 5A and the second power module 5B, respectively. On the other hand, an opening 49 is formed in the parts to make coolant path 48. By fixing the first power module 5A and the second power module 5B to the parts to make coolant path 48, the radiating fins for cooling project to the inside of the coolant path 7 from the opening 49, respectively. The opening 49 is closed by a metal wall around the radiating fin and a coolant path is formed. At the same time, the opening 49 is closed so that the cooling water may not leak.

The first power module 5A and the second power module 5B are disposed on the right and left sides, respectively, of a virtual line segment which is orthogonal to the surface of the sidewall where the inlet tube 72 of the cooling water and the outlet tube 74 of the cooling water of the metal casing 6 are formed.

The coolant path formed inside the parts to make coolant path 48 extends from the inlet tube 72 of the cooling water to the other end along the longitudinal direction of the bottom portion of the metal casing. Then, the coolant path is turned up in the shape of U at the other end. The coolant path further extends to the outlet tube 74 along the longitudinal direction of the bottom portion of the metal casing 6. Two sets of parallel paths along the above longitudinal direction are formed in the parts to make coolant path 48, and the opening 49 so provided as to penetrate respective paths is formed in the parts to make coolant path 48. The first power module 5A and the second power module 5B are fixed to the parts to make coolant path 48 along the above path.

Efficient cooling is accomplished by the radiating fins in the first and second power modules 5A and 5B projecting into the path. Also, an efficient cooling structure can be realized by the heat dissipation surfaces of the first power module 5A and the second power module 5B coming into close contact with the metal parts to make coolant path 48. Furthermore, the cooling effect is improved while the structure becomes compact, since the openings 49 are closed, respectively, by the heat dissipation surfaces of the first power module 5A and the second power module 5B.

A first drive circuit board 1A and a second drive circuit board 1B are provided in parallel being superimposed on the first power module 5A and the second power module 5B, respectively. The first drive circuit board 1A and the second drive circuit board 1B constitute the drive circuit board 1 shown in FIG. 1.

The first drive circuit board 1A disposed above the first power module 5A is formed a little smaller than the first power module 5A when it is seen in a plan view. Similarly, the second drive circuit board 1B disposed above the second power module 5B is also formed a little smaller than the second power module 5B when it is seen in a plan view.

The inlet tube 72 and the outlet tube 74 for the cooling water are formed in the side face of the metal casing 6. A hole 81 is further formed in the side face, and a connector 82 for signals is provided in the hole 81.

Above the first drive circuit board 1A and the second drive circuit board 1B, the capacitor module 13 having two or more capacitors for smoothing are provided, and the capacitor module 13 comprises a first capacitor module 13a and a second capacitor module 13b. The first capacitor module 13a and the second capacitor module 13b are provided above the first drive circuit board 1A and the second drive circuit board 1B, respectively.

Above the first capacitor module 13a and the second capacitor module 13b, a plate-like retainer board 62 is provided tightly contacting the inner wall of the metal casing 6, and fixed. This retainer board 62 supports the first capacitor module 13a and the second capacitor module 13b onto the side of the power module. Also, the retainer board holds the rotating electrical machine control circuit board 75 onto the reverse side, and fixes it there. This retainer board 62 is made of a metal material. The retainer plate 62 passes the heat generated by the capacitor modules 13a and 13b and the control circuit board 75 on which the rotating electrical machine control unit MCU is mounted to the metal casing 6 and dissipates it.

As described above, the power module 5, the drive circuit board 1, the capacitor module 13, the retainer plate 62, and the control circuit board 75 are housed in the metal casing 6, and the opening in the upper portion of the metal casing 6 is closed by the metal cover 90. The cover 90 is fastened to the metal casing 6 by using screws 50.

Further, when the sidewall in which the inlet tube 72 and the outlet tube 74 for the cooling water of the metal casing 6 are formed is regarded as a front, a terminal box 80 is attached to the sidewall. Provided in the terminal box 80 are DC power connectors 95, 96 for supplying DC power from the battery 70 to the connection terminals 15c, 16c of the capacitor module 13, a terminal 85 for DC power provided therein, AC power connectors 91, 92 for connection to the first and second rotating electrical machines 130, 140, and an AC terminal 83 provided therein.

The terminal 85 for the DC power is electrically connected to electrodes of the first capacitor module 13a and the second capacitor module 13b through a bus-bar. The AC terminal 83 is electrically connected to the terminals of two or more power modules 5A and 5B which constitute the power module 5 through the bus-bar, respectively.

The terminal box 80 is constituted by attaching the bottom plate part 64 on which the terminal 85 for DC power is disposed and the cover 66 to the main body 84. This is for enabling the assembly of the terminal box 80 easy.

Figure 5:
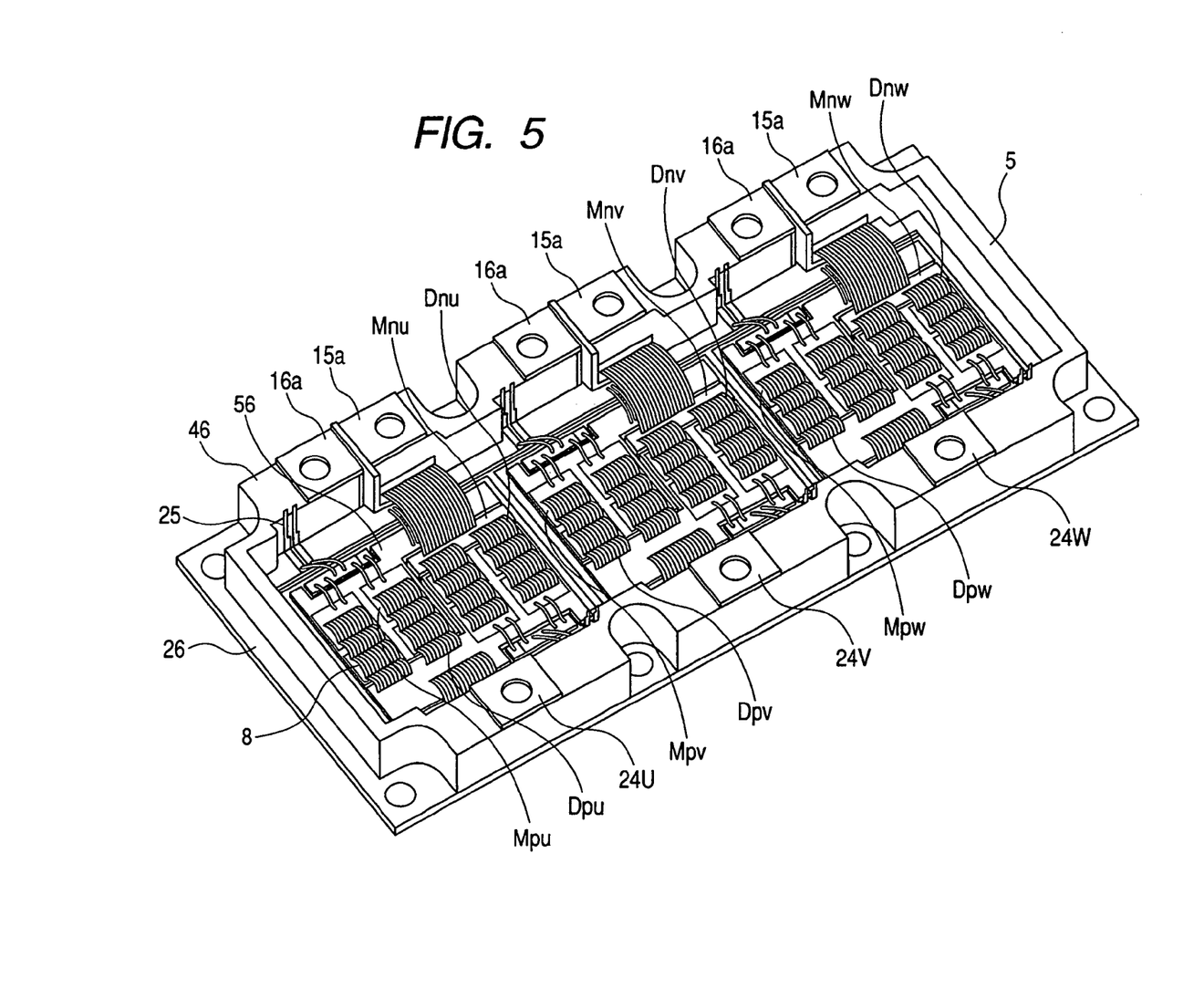
FIG. 5 is a perspective view of a power module according to an embodiment of the present invention.

With the above structure, the compact power converter unit 20 can be provided. A perspective view of the power module 5 according to the present example is shown in FIG. 5.

The power module 5 comprises two or more power semiconductor devices M (Mpu, Mnu, Mpv, Mnv, Mpw, Mnw). Moreover, diodes D for returning electric currents (Dpu, Dnu, Dpv, Dnv, Dpw, Dnw) are provided in parallel with the power semiconductor devices M. Also, according to the present example, with respect to the power semiconductor devices M and the diodes D, identical two devices are connected in parallel to constitute the individual device on the circuit. However, the number of devices can be suitably changed according to specifications etc.

The connection terminals to be connected to the capacitor module 13 are arranged along opposing long sides of the power module 5. Two or more plus side connection terminals 16a and minus side connection terminals 15a are arranged in a single row. Moreover, the connection terminals 24U, 24V, and 24W for outputting the alternating current which drives the rotating electrical machine 130 are arranged in a row on the other long side of the power module 5. The drive control of the rotating electrical machine 130 is carried out by outputting the three-phase alternating currents of a U phase, a V phase, and a W phase from the connecting terminal parts 24U, 24V, and 24W, respectively. The power semiconductor device M, diode D, and each connection terminal are electrically connected by aluminum wires 8.

Moreover, gate pins 25 for transmitting a control signal (gate signal) given from the drive circuit board 1 to gate terminals of the power semiconductor devices M (Mpu, Mnu, Mpv, Mnv, Mpw, Mnw) are provided in the power module 5. The power semiconductor devices M are controlled based on the gate signal from the drive circuit board 1. Since six sets of power semiconductor devices M are disposed, six sets of gate pins connected to respective power semiconductor devices M are provided.

The power semiconductor devices M and diodes D are mounted on an isolated substrate 56, such as one made of aluminium nitride (AlN). Since aluminium nitride (AlN) has good thermal conductivity, it is preferably used. Moreover, it is also possible to replace aluminium nitride (AlN) with silicon nitride (SiN). Since silicon nitride (SiN) is highly tenacious, a thin isolated substrate 56 can be formed.

On the side of the metal base 26 of the isolated substrate 56, a pattern is formed on the whole surface or on the part of it with a nickel plated copper etc. A wiring pattern is formed on the surface on which the power semiconductor device M etc. are arranged with the nickel plated copper etc. By adhering metals to both sides of the isolated substrate 56, the power semiconductor device M etc. and the metal base 26 can be soldered. At the same time, a sandwich structure wherein the isolated substrate 56 is sandwiched between metals is achieved. With the above structure, when the temperature changes, the deformation caused by the difference in the thermal expansion coefficient can be suppressed.

As a result of adopting the sandwich structure, if the isolated substrate 56 is made thin, at the time of switching of the power semiconductor device M, according to the change in the electric current flowing through the wiring pattern on the side where the power semiconductor device M is mounted, the eddy current introduced to the whole surface pattern on the side of the metal base 26 increases. As a result, the parasite inductance of the wiring pattern on the isolated substrate 56 can be reduced, which leads to low inductance of the power module 5.

Moreover, the metal base 26 formed of copper etc. is provided in the lower part of the power module 5. Under the metal base 26, linear or pin-like radiating fins (not shown) are formed. By mounting the power module 5 in the metal casing 6, the coolant path is formed and cooling water flows directly under the metal base 26.

Figure 6:
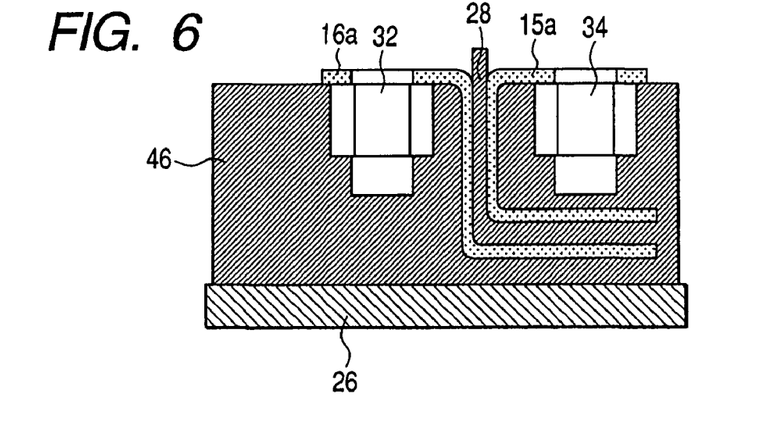
FIG. 6 is a cross-sectional view of a principal part of the power module according to an embodiment of the present invention.

FIG. 6 is a cross-sectional view of the connection terminals 15a and 16a of a DC terminal. The connection terminals 15a and 16a are fixed to a resin case 46. At the end portion for connection to the capacitor module 13, the plus side connection terminal 16a and the minus side connection terminal 15a are bent in the directions opposite to each other. Moreover, the plus side connection terminal 16a and the minus side connection terminal 15a are laminated via the isolation parts 28, such as an insulation sheet. According to such a layer structure, since the electric current which flows through the connection terminals 15a and 16a will flow in a reverse direction and the magnetic fields which electric currents produce negate with each other, which can reduce inductance.

Moreover, in order to make easy the interconnection with the capacitor module 13 connected to the connection terminals 15a and 16a easy, nuts 32 and 34 are embedded in the resin case 46, and the capacitor module 13 is mounted by using screws. However, in order to make the connection easier, it is possible to allow it connected by welding etc. instead of screws.

EXAMPLE 1

Figure 7:
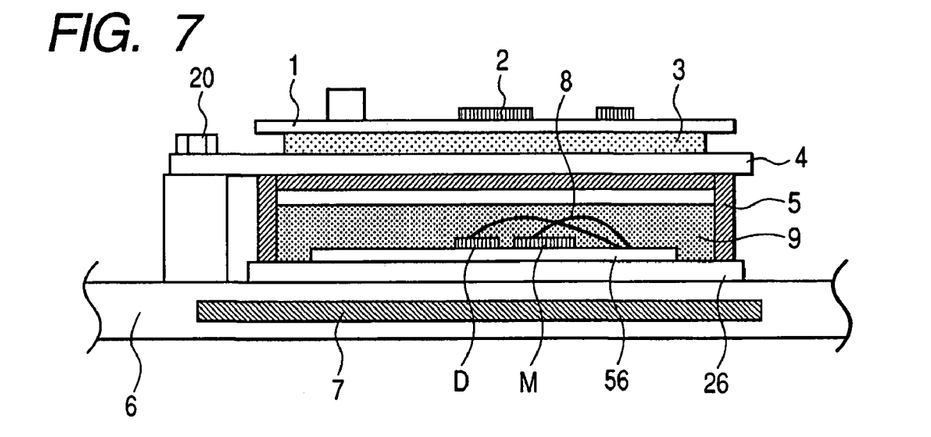
FIG. 7 is a cross-sectional view of a structure of a power module according to Example 1 of the present invention.

A cross-sectional view of the structure of the power converter unit 20 which is Example 1 of the present invention is shown in FIG. 7. In FIG. 7, reference numeral 1 indicates a drive circuit board for driving the power semiconductor device, 2 indicates electronic parts on the drive circuit board 1, 3 indicates a heat dissipating sheet, 4 indicates a metal plate, 5 indicates a power module having the power semiconductor device M and the diode D, molded in resin 9, and 6 indicates the metal casing.

The drive circuit board 1, the heat dissipating sheet 3, the metal plate 4, the power module 5, and the metal casing 6 are assembled in this order from the top.

A circuit for performing the drive control of the power semiconductor device M of the power module 5 is mounted on the drive circuit board 1 (drive circuit unit DCU). The drive circuit board 1 is fixed to the power module 5, and the control terminals of the drive circuit board 1 and the power module 5 are electrically connected by soldering etc. Further, the drive circuit unit DCU is mounted on the drive circuit board 1 of the present example. However, in addition to this, the rotating electrical machine control unit MCU may also be mounted on the drive circuit board 1.

On the drive circuit board 1, there are mounted a driver IC for driving the power semiconductor device M and a plurality of electronic parts 2 being heat generating parts such as a photo-coupler, a buffer transistor, a capacitor, and a microcomputer.

The heat dissipating sheet 3 is disposed between the drive circuit board 1 and the metal plate 4 serving as a shielding plate. The heat dissipating sheet 3 is used in order to allow the heat of the drive circuit board 1 to escape from the metal plate 4 efficiently to the metal casing 6.

A high-voltage portion whose electric potential is the same as that of the power semiconductor device M is provided on the drive circuit board 1. Therefore, it is necessary to secure insulation between itself and the metal plate 4 whose potential is dropped to that of the metal casing 6. For this reason, the material having high degree of thermal conductivity and insulation property is used for the heat dissipating sheet 3. In the present example, a silicon sheet containing a ceramic filler is used. The silicon sheet has a thickness of about 2.7 mm, thermal conductivity of about 1.2 W/mK, and electric breakdown strength of about 26 kV. As a silicon sheet containing a ceramic filler, it is desirable to use one whose heat conductivity is 1-5 W/mK. However, the silicon sheet is not limited to this. For instance, as the heat dissipating sheet 3, a sheet of an EPDM rubber (ethylene-propylene rubber) can also be used. In this case, one having the heat conductivity of 1 W/mK or less may be used. Moreover, it may be the one using other materials.

The metal plate 4 is made of aluminum. In order to efficiently allow the heat transmitted from the drive circuit board 1 and the heat dissipating sheet 3 to escape, one end of the metal plate 4 is fixed to the metal casing 6 which enables the cooling water to flow back. In the present example, the metal plate 4 is fixed to the metal casing 6 by using screws 20. However, the method of fixing the metal plate 4 is not limited to this, and the metal plate 4 may be fixed by other methods such as welding.

Moreover, the metal plate 4 prevents the control circuit on the drive circuit board 1 from malfunctioning due to the noise emitted from the power semiconductor device M of the power module 5. Aluminum, which has high heat conductivity and a shielding effect, is used for the metal plate 4 of the present example. However, other metals such as copper, materials such as anisotropic carbon, or a heat pipe, etc. may be used.

Moreover, oxidization can effectively be prevented by applying nickel plating etc. on the surface of the metal plate 4.

The power module 5 is fixed to the metal casing case 6. The power semiconductor device M provided inside the power module 5 is driven under the control of the control circuit on the drive circuit board 1. So as to form a three-phase bridge circuit, one power semiconductor device M and the other power semiconductor device M, one power semiconductor device M and an input terminal, and one power semiconductor device M and an output terminal, are electrically connected, respectively, by an aluminum wire 8. However, the connection can also be made by using a plate-like conductor etc. instead of the aluminum wire 8.

Further, since the power semiconductor device M performs the switching operation at a high voltage, it generates a large amount of heat. For this reason, a coolant path 7 is provided in the metal casing 6. In the coolant path 7, cooling water to cool the heat from the power semiconductor device M is allowed to flow. To raise cooling efficiency, radiating fins for increasing the contact area with a coolant can be provided in the coolant path 7. As the radiating fins, linear or pin-shaped fins are used.

In the present example, the coolant path 7 is provided inside the metal casing 6. However, the structure is not limited to this, and a direct cooling structure for allowing the base portion of the power module 5 to directly contact the coolant can be adopted. In this structure, an opening portion serving as the coolant path 7 is provided in the metal casing 6. By disposing a metal base 26 of the power module 5 directly on the opening portion, the coolant path 7 is formed. In this regard, it is possible to provide the linear or pin-shaped radiating fins on the metal base 26 of the power module 5.

Also, the power semiconductor device M is provided on an isolated substrate 56 on which a copper wiring pattern has been arranged, and is sealed with resin, such as silicon gel. For this reason, the temperature of the silicon gel is raised by the heat which the power semiconductor device M has generated. As a result, the heat is transmitted to the metal plate 4 and the drive circuit board 1, raising their temperatures. Therefore, in order to prevent the temperature rise of the metal plate 4 and the drive circuit board 1, the power module 5 is sealed by a cover made of resin etc.

As described above, with a simple structure, the heat of the drive circuit board 1 is efficiently transmitted from the drive circuit board 1 to the heat dissipating sheet 3, metal plate 4, and metal casing 6. Therefore, even when an ambient temperature is high, it is possible to keep the temperature of the drive circuit board 1 as low as the temperature of the metal casing 6.

Moreover, electromagnetic noise emitted from the power semiconductor device M is intercepted by the metal plate 4 connected to the metal casing 6. Therefore, it becomes possible to reduce the risk of the drive circuit 1 malfunctioning, and the power converter unit being excellent in noise immunity can be provided.

Moreover, since a distance between the power module 5 and the drive circuit board 1 can be shortened while securing heat resistance and noise immunity, the gate pins 25 (FIG. 5) for connecting them can be short, and it becomes possible to reduce the inductance of this portion.

EXAMPLE 2

Figure 8:
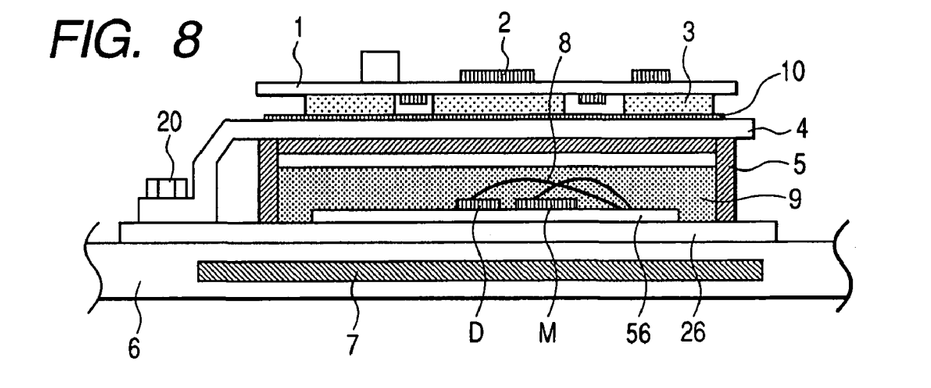
FIG. 8 is a cross-sectional view of a structure of a power module according to Example 2 of the present invention.
Figure 9:
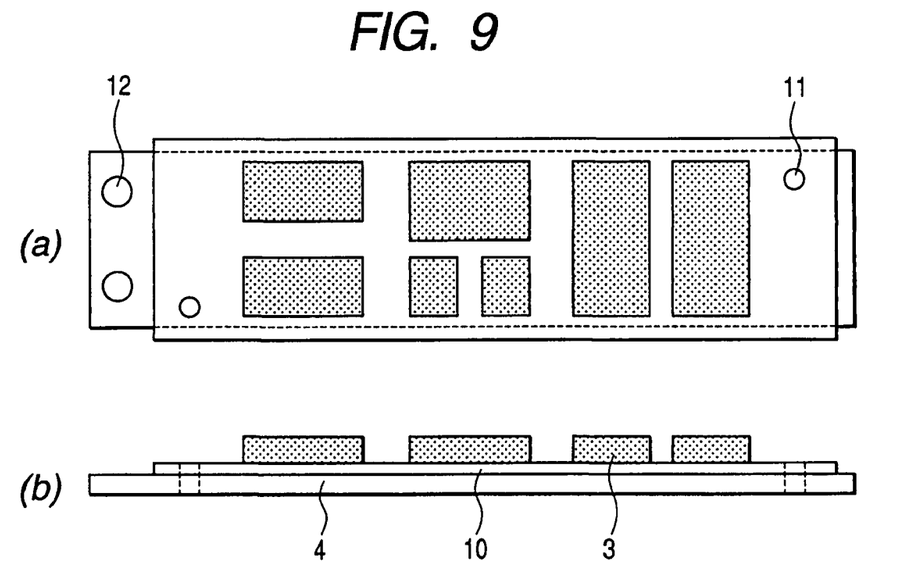
FIG. 9 shows plan views showing structures of an assembly comprising a heat dissipating sheet and a metal plate of Example 2 of the present invention.

Next, the power converter unit, which is Example 2 of the present invention, will be explained. FIG. 8 is a cross-sectional view of a structure of the power converter unit of Example 2, and FIG. 9 shows plan and cross-sectional views of the principal part of the power converter unit.

The power converter unit of Example 2 has, as in Example 1, the drive circuit board 1, the heat dissipating sheet 3, the metal plate 4, the power module 5, and the metal casing 6 as shown in FIG. 8. However, the structure of Example 2 differs from the structure of Example 1 in that the heat dissipating sheets 3 are disposed only in the thermally affected portions. That is, in the present example, the heat dissipating sheet 3 is divided into two or more sheets, and each heat dissipating sheet 3 is selectively provided directly under heat generating parts such as a driver IC and a photo-coupler. The cost of the heat dissipating sheets 3 can be reduced by selectively providing them directly under the thermally affecting parts such as the driver IC whose maximum allowable temperature is about 125° C. or the photo-coupler whose maximum allowable temperature is about 100° C.

Further, the heat dissipating sheet 3 is not provided at comparatively heat-resistant portions. Therefore, it becomes impossible to secure the electrical insulation between itself and the metal plate 4 connected to the metal casing 6. In the present example, however, electrical insulation is secured by providing an insulating sheet 10 under the heat dissipating sheet 3.

Moreover, on the drive circuit board 1, electronic parts are mounted on the surface in contact with the heat dissipating sheet 3. That is, it is a double-sided package structure where electronic parts are mounted on both sides of the drive circuit board 1. By adopting such a structure, a parts-mounting area can be made small. In this regard, the electronic parts mounted on the surface in contact with the heat dissipating sheet 3 is arranged between the divided two or more heat dissipating sheets 3. Since the heat dissipating sheets 3 are arranged directly under heat generating parts, such as the driver IC and photo-coupler, those electronic parts are not positioned directly under the heat generating parts.

As the insulating sheet 10 of the present example, a polyester sheet (PET sheet) is used. This sheet has a property of about 0.16 W/mK in heat conductivity, about 0.1 mm in thickness, and 12.5 kV in breakdown strength. In addition, since it is necessary to take into consideration not only the insulation property but also a maximum allowable temperature of the insulating sheet 10, it is desirable to use a sheet with a maximum allowable temperature being as high as possible. As the insulating sheet 10, in addition to the polyester sheet, for instance, a polyphenylsulfide sheet (PPS sheet), a polyolefin sheet (PP sheet), etc. can also be used.

Although the heat conductivity of the insulating sheet 10 is not good as compared with the heat dissipating sheet 3, it can suppress deterioration of the heat dissipation property by adopting the insulating sheet 10 which is thinner than the heat dissipating sheet 3. Although the heat dissipating sheet 3 of about 2-3 mm thick is used, for instance, the insulating sheet 10 of 0.1-0.2 mm thick is adopted. However, the thicknesses of these sheets do not necessarily have to be the above, and can be suitably changed according to the environment, other restrictions, etc.

For example, on the surface in contact with the heat dissipating sheet 3, electronic parts are mounted on the drive circuit board 1 of the present example. The electronic part is mounted on the drive circuit board 1 so that it may be surrounded by the heat dissipating sheet 3 and the insulating sheet 10. For this reason, it is necessary to make a thickness of the heat dissipating sheet 3 at least greater than a height of the electronic part.

When using a thin heat dissipating sheet 3, it is desirable that surface-mounting electronic parts alone are disposed on this surface, and comparatively large parts such as a capacitor are mounted on the surface opposite to the surface in contact with the heat dissipating sheet 3. However, due to restriction of space etc., when large parts such as discrete parts are disposed on the surface in contact with the heat dissipating sheet 3, the thickness of the heat dissipating sheet 3 may be made larger than the height of the discreet part etc.

Moreover, in order to ensure insulation of the drive circuit where electric potential varies at a high voltage and the metal plate 4 connected to the metal casing 6, it is desirable to make the dimension of the insulating sheet 10 larger than the metal plate 4. However, it is not necessary to use the insulating sheet 10 larger than the metal plate 4 to cover the whole dimension. In order to secure the distance for insulation between the electronic part etc. on the drive circuit board 1 etc. and the metal plate 4, locations of the drive circuit board 1, electronic part, etc., are taken into consideration. Therefore, the structure may be the one in which the insulating sheet 10 spreads toward the outside of the metal plate 4.

Moreover, the metal plate 4 and the insulating sheet 10 have the hole 11 for positioning to decide the relative spatial relationship between themselves and the power modules 5. The hole 11 for positioning is constituted so that it may be made through the projection for positioning provided in the power module 5. By forming such a hole 11 for positioning, the metal plate 4 and the insulating sheet 10 can be more easily mounted on the power module 5.

Furthermore, in the present example, an end portion of the metal plate 4 is bent and is fastened to a base material of the power module 5 with a screw. With such a structure, parts for the power module 5 can be assembled in advance. Therefore, it becomes possible to easily assemble the power converter unit.

Still further, in the present example, the heat dissipating sheet 3 is divided into two or more sheets and disposed directly under heat generating portions such as the driver IC and the photo-coupler, namely, at thermally affected portions. Alternatively, for instance, a heat dissipating sheet 3 which is entirely or partly meshed may be used. As required, the mesh heat dissipating sheet 3 may be divided into two or more sheets. With such a structure, the heat dissipation property can be secured while reducing the cost.

EXAMPLE 3

Figure 10:
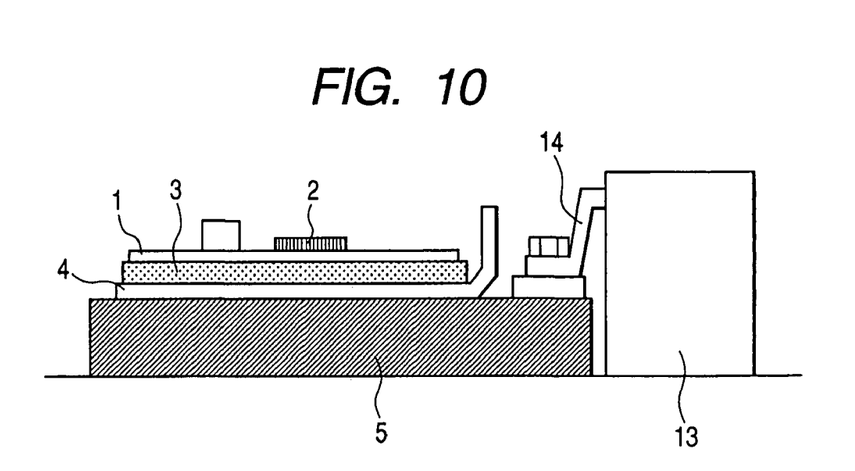
FIG. 10 is across-sectional view showing of a power converter unit of Example 3 of the present invention.

Now, a power converter unit of Example 3 of the present invention will be described. FIG. 10 is a cross-sectional view showing the structure of the power converter unit of Example 3.

In Example 3, reference numeral 13 indicates a capacitor module for smoothing a current at the time of switching of the power semiconductor device M, and reference numeral 14 indicates a bus-bar formed as one body with the capacitor module 13. The bus-bar 14 is fastened to the terminal of the power module 5 with screws.

Generally, when the power semiconductor element M is driven, a steep current flows from the capacitor module 13 to the power semiconductor device. Therefore, if the drive circuit board 1 is located near the bus-bar 14 or the terminal of the power semiconductor device M, it may be affected by the electromagnetic noise of the power semiconductor device and may malfunction. Therefore, in the present example, the metal plate 4 is bent and is provided between the bus-bar 14 being a noise source and the drive circuit board 1. With such a structure, the drive circuit board 1 can effectively be shielded against the electronic noise.

Thus, according to the structures of Examples 1 to 3, the heat of the drive circuit board can be allowed to escape effectively from the drive circuit board to the heat dissipating sheet, the metal plate, and the casing. Further, the process of curing the adhesive and additional members such as the flexible substrate are not necessary. Therefore, it becomes easier to assemble the power converter unit, improving the productivity.

Further, the metal plate 4 connected to the metal casing 6 is disposed between the drive circuit board 1 and the power semiconductor device M. Therefore, it becomes possible to shield the electronic noise emitted from the power semiconductor device M, improving the noise immunity of the drive circuit board 1.

Thus, according to the examples described above, with the simple structure, both the noise immunity and high heat dissipation performance can be achieved, which makes it possible to provide a power converter unit having noise immunity and high heat dissipation performance.

What is claimed is:

1. A power converter unit comprising:
a metal casing;
a power module mounted in said metal casing and equipped with a plurality of power semiconductor devices;
a metal plate mounted on said power module and fixed to said metal casing;
a heat dissipating sheet disposed on said metal plate; and
a drive circuit board which controls said power semiconductor devices and is disposed on said heat dissipating sheet.

2. A power converter unit according to claim 1, wherein an insulating sheet is provided between said metal plate and said heat dissipating sheet.

3. A power converter unit according to claim 2, wherein said heat dissipating sheet is divided into two or more sheets and provided on said insulating sheet.

4. A power converter unit according to claim 3, wherein said heat dissipating sheet is disposed on one side face of the drive circuit board opposite to the other side face of the drive circuit board on which the electronic parts are mounted.

5. A power converter unit according to claim 3,
wherein electronic parts are mounted on a surface of said drive circuit board which is in contact with said heat dissipating sheet; and
wherein electronic parts are disposed between said divided two or more heat dissipating sheets.

6. A power converter unit according to claim 2, wherein said heat dissipating sheet is meshed.

7. A power converter unit according to claim 5, wherein said metal plate is fixed to said metal casing with screws.

8. A power converter unit according to claim 2, wherein said metal plate and said insulating sheet have a positioning hole for defining a positional relationship relative to said power module.

9. A power converter unit according to claim 1, wherein said metal casing, which is disposed between said metal plate and said power module has a coolant path therein.

10. A power converter unit according to claim 1, further comprising a capacitor,
wherein said capacitor is electrically connected to said power module through a bus-bar; and
wherein said metal plate is bent and part of it is positioned between said bus-bar and said drive circuit board.

11. A power converter unit comprising:
a power module including two or more power semiconductor devices for converting a direct current supplied from a battery to a three-phase alternating current;
a capacitor module including two or more capacitors for smoothing said direct current;
a metal plate mounted on said power module;
a heat dissipating sheet disposed on said metal plate; and
a drive circuit board which is disposed on said heat dissipating sheet and includes a circuit for supplying a control signal to said two or more power semiconductor devices.

12. A power converter unit according to claim 11, wherein an insulating sheet is provided between said metal plate and said heat dissipating sheet.

13. A power converter unit according to claim 11, wherein said power module is mounted in a metal casing and said metal plate is fixed to said metal casing.

14. A power converter unit according to claim 11,
wherein said power module has a plus side connection terminal and a minus side connection terminal for connection to said capacitor module; and
wherein said plus side connection terminal and said minus side connection terminal are superimposed with isolation parts therebetween.

15. A power converter unit according to claim 14, wherein said plus side connection terminal and said minus side connection terminal are bent at their end portions for connection to said capacitor module in directions opposite to each other.

16. A power converter unit according to claim 14, wherein said power module includes a rein casing made of resin; and
wherein at least part of said plus side connection terminal and at least part of said minus side connection terminal are fixed inside said resin casing.

17. A power converter unit according to claim 16, wherein said plus side connection terminal is constituted by a plurality of plus side connection terminals s and said minus side connection terminal is constituted by a plurality of minus side connection terminals, the plus side connection terminals and the minus side terminals being arranged in a row along one side of said resin casing.

18. A power converter unit according to claim 16,
wherein said power module has AC connection terminals for outputting said three-phase alternating current;
wherein said AC connection terminals are arranged in a row along a side opposing the side of said resin casing along which said plus side connection terminals and said minus side connection terminals are arranged.

19. A power converter unit according to claim 11,
wherein said power semiconductor devices are disposed on one face of an insulating substrate; and
wherein metal patterns are formed on both the surfaces of said insulating substrate.

20. A power converter unit according to claim 19, wherein said isolated substrate is made of silicon nitride (SiN).

* * * * *